United States Patent [19]

Gibson et al.

[11] Patent Number: 4,901,121
[45] Date of Patent: Feb. 13, 1990

[54] SEMICONDUCTOR DEVICE COMPRISING A PERFORATED METAL SILICIDE LAYER

[75] Inventors: John M. Gibson, Upper Montclair; John C. Hensel; Anthony F. Levi, both of Summit; Raymond T. Tung, New Providence, all of N.J.

[73] Assignee: American Telephone & Telegraph Co., AT&T Bell Labs., Murray Hill, N.J.

[21] Appl. No.: 185,288

[22] Filed: Apr. 18, 1988

Related U.S. Application Data

[63] Continuation of Ser. No. 717,649, Mar. 29, 1985, abandoned.

[51] Int. Cl.$^4$ .................. H01L 29/48; H01L 21/24
[52] U.S. Cl. ....................... 357/15; 357/4; 357/22; 357/34; 437/111; 437/178; 437/179; 437/201; 437/202; 437/DIG. 142; 437/DIG. 147
[58] Field of Search ............... 357/4, 15, 20, 34, 67 S, 357/71 S, 88; 437/111, 178, 179, 201, 202, DIG. 142, DIG. 147

[56] References Cited

U.S. PATENT DOCUMENTS

| | | | |
|---|---|---|---|
| 4,378,629 | 4/1983 | Bozler et al. | 29/580 |
| 4,488,038 | 12/1984 | Harrison | 357/15 |
| 4,492,971 | 1/1985 | Bean et al. | 357/15 |

OTHER PUBLICATIONS

Bozler et al., IEEE Transactions on Electron Devices, vol. ED—27, No. 6 (Jun. 1980), pp. 1128-1141.
Extended Abstracts of the 15th Conference on Solid State Devices and Materials, Tokyo, (1983), "Study on Formation of Solid-Phase-Epitaxial $CoSi_2$ Films and Patterning Effects", Ishibashi et al., pp. 11-14.
Proceedings of the 2nd International Symposium on Molecular Beam Epitaxy, Tokyo, (1982), "Low-Temperature Surface Cleaning of Silicon and its Application to Silicon MBE", Ishizaka et al., pp. 183-186.
Japanese Journal of Applied Physics, vol. 23, No. 7, (Jul. 1984), "Formation of Embedded Monocrystalline $NiSi_2$ Grid Layers in Silicon by MBE", Ishazaka et al., pp. L499-L501.
IEEE Transactions on Electron Devices, vol. ED-27, No. 6, (Jun. 1980), "Fabrication and Numerical Simulation of the Permeable Base Transistor", Bozler et al., pp. 1128-1141.
Proceedings of the IEEE, vol. 52, (Dec. 1964), "The Metal-Gate Transistor", Lindmayer, p. 1751.

Primary Examiner—Edward J. Wojciechowicz
Attorney, Agent, or Firm—Eugen E. Pacher

[57] ABSTRACT

A method for producing, without etching, a perforated layer of epitaxial metal silicide, especially $CoSi_2$, on a single crystal Si substrate, with epitaxial Si overlying the silicide layer. The layer thickness, and the number and size of the openings in the layer are such as to make the structure suitable as an electronic device, in particular, as a permeable base transistor. The number and/or size of the openings is a function of processing parameters such as the substrate orientation, the annealing temperature of the film, or the Co/Si ratio of the deposited material. A device comprising a perforated silicide layer is also disclosed.

9 Claims, 2 Drawing Sheets

SEMICONDUCTOR DEVICE COMPRISING A PERFORATED METAL SILICIDE LAYER

This application is a continuation of application Ser. No. 717,649, filed Mar. 29, 1985, now abandoned.

FIELD OF THE INVENTION

This invention pertains to the field of semiconductor devices comprising an active metallic region, and to methods for producing such a device.

BACKGROUND OF THE INVENTION

From the beginning of semiconductor device technology, physicists have postulated a host of semiconductor heterostructures, i.e., combinations of layers of different materials in a single composite crystal. The fascination in this kind of structure is traceable to the large selection of electrical properties thus potentially available to device designers. The early visions of a wide variety of combinations have not yet been realized, and it is now recognized that some semiconductor heterostructures of sufficient crystalline quality for state of the art devices are difficult to produce.

A class of heterostructures comprising a single crystal silicon substrate and an epitaxial metal silicide layer thereon, with epitaxial silicon overlying the silicide layer, has been disclosed in U.S. Pat. No. 4,492,971, and a method for producing such structures is disclosed in U.S. patent application Serial No. 445,014, filed Nov. 29, 1982, both incorporated herein by reference. A ballistic transistor advantageously embodied in a silicon/silicide/silicon heterostructure, with the silicide preferably being cobalt silicide or nickel silicide, is disclosed in U.S. patent application Serial No. 637,061 ('061), filed Aug. 2, 1984, also incorporated herein by reference.

A Semiconductor device, commonly referred to as a permeable base transistor (PBT) was disclosed by C. O. Bozler et al. in U.S. Pat. No. 4,378,629 ('629), also incorporated herein by reference. As described in the '629 patent and in a series of subsequent publications, a PBT comprises a semiconductor substrate, typically GaAs, with a patterned metal (typically W) layer deposited thereon, and with a further semiconductor layer deposited onto the metal layer, with semiconductor material connecting the semiconductor layer to the substrate through apertures etched through the metal layer. The metal layer is patterned by known processes, typically photolithography and subsequent dry etching. Typically, the patterned metal layer comprises metal fingers, with the spaces between the fingers being semiconductor-filled apertures. However, '629 also discloses that other geometries, e.g., comprising holes, are possible, but may not offer the high transconductance-to-capacitance ratio ascribed to the preferred grating structure (see column 14 of '629).

The operation of a PBT is significantly affected by the choice of metal layer thickness and aperture size. As taught by the prior art, the thickness of the metal layer should in the order of 10% of the zero bias depletion width of the semiconductor material, and the width of the slits in the metal layer should be of the order of the zero bias depletion width. For example, for a carrier concentration of $1.10^{16}$ cm$^{-3}$ in the substrate material, a grating consisting of 200 Å thick metal fingers of 2000 Å width, separated by slits of 2000 Å width, meets the above criteria.

As can be seen from the above exemplary dimensions, the patterned metal layer has small features indeed, and the production of such a pattern by conventional means is difficult. Furthermore, lithography and etching generally require operations that are not carried out in UHV, resulting in contamination problems. This may increase defect densities.

A metal base transistor of the above described type, i.e., comprising a patterned metal layer comprising a grating, embodied in silicon/silicide/silicon, is disclosed in U.S. Pat. No. 4,488,038. See also A. Ishizaka and Y. Shiraki, *Japanese Journal of Applied Physics,* Volume 23(7), pp. L499-L501 (1984), where the formation of an embedded monocrystalline NiSi$_2$ grid in silicon is reported.

The mode of operation of a PBT is well known to those skilled in the art and requires no detailed discussion here. See, for instance, C. O. Bozler et al, *IEEE Transactions on Electron Devices,* Volume ED-27(6), pp. 1128-1141 (1980), and the '629 patent. Briefly, due to the small width of the slits in the metal layer, there exists a potential barrier in the semiconductor material extending through the slits. The height of this barrier can be varied by means of a voltage applied to the metal layer, whereby the flow of electrons between the semiconductor overlayer and the semiconductor substrate can be changed. One of the semiconductor regions is conventionally referred to as the emitter, and the other as the collector, whereas the metal layer is referred to as the base. For the sake of clarity of exposition, we will herein generally refer to the substrate layer as the collector and to the semiconductor overlayer as the emitter, without thereby foreclosing the possibility of a device in which the active regions are reversed, or which otherwise differs from the conventional three-terminal structure.

As is known to the prior art, a possible base configuration is that of a "grid". The minimum dimension of grid openings typically should not exceed the depletion layer thickness. For most practical doping levels, such openings are too small to be produced conveniently by known methods.

A structure which comprises a metal layer that was said to act similar to a very fine grid is reported in J. Lindmayer, *Proceedings of the IEEE,* Volume 52, page 1751 (1964). The metal base layer in question was reported to be nonuniform, with current flowing through a large number of thin portions (also referred to as "weak" points) of the polycrystalline base layer. K. Ishibashi et al., *Extended Abstracts of the 15th Conference on Solid State Materials,* Tokyo 1983, pp. 11-14, disclose that relatively thick (100 nm) CoSi$_2$ films grown on Si by solid phase epitaxy often are of poor crystalline quality and often "break", exposing the substrate. See, for instance, FIG. 1 of that reference. These authors also give prescriptions for improving the quality of such films. This reference thus exemplifies the proposition that workers in the field have generally directed their efforts towards producing silicide layers of the highest possible perfection.

Because the characteristics of a PBT depend, inter alia, on the size and geometry of the apertures in the base, it would be desirable to have available a lithography-free method, that allows uninterrupted growth of the heterostructure in clean UHV conditions, for producing an appropriately perforated thin silicide layer on Si, with the openings in the layer having a most likely effective diameter of the order of the depletion layer thickness in the semiconductor. This application discloses such a method, and devices produced by the method.

SUMMARY OF THE INVENTION

We have discovered that it is possible to produce, without lithography or etching, by appropriate choice of processing parameters, a layer of silicide on Si, typically $CoSi_2$, of thickness suitable for use in a PBT, that has a substantially predetermined density of openings or perforations, of average effective diameter of the order of the depletion layer thickness in the silicon. We have constructed an electronic device that comprises such a perforated layer and have demonstrated transistor action in such a device.

For instance, we have found that $CoSi_2$, when grown on a single crystal silicon substrate, prepared such that the relevant substrate surface makes an angle $\theta$ less than about 6° with a (111) lattice plane, can grow in the form of perforated epitaxial single crystal on silicon. Appropriate choice of processing conditions, to be discussed later, can produce perforated silicide layers of the type discussed herein on substrates of other orientation.

A device according to the invention typically comprises an epitaxial doped Si region (the emitter) atop the epitaxial perforated base silicide layer, with columnar silicon from the emitter extending through the perforations in the base to the single crystal doped Si substrate (the collector). The thickness of the silicide layer is advantageously between about 5 and 50% of the zero bias depletion width of the semiconductor, the apertures in the silicide layer advantageously have a most likely effective diameter in the range from about 10 to about 100% of the zero bias depletion width, and the perforated silicide layer is produced by a process that does not comprise etching of the silicide layer, to thereby produce the apertures in the silicide layer. Instead, the apertures are naturally produced during growth of the heterostructure. The inventive process thus comprises a departure from the general spirit of the prior art, in that it deliberately produces a structurally nonhomogeneous silicide layer.

Since $CoSi_2$ can have a relatively long mean free path, it may be possible to construct devices in which part of the collector current is transmitted ballistically through the silicide, and such hybrid devices are contemplated by us to be within the scope of this invention.

DETAILED DESCRIPTION

Figure 1:
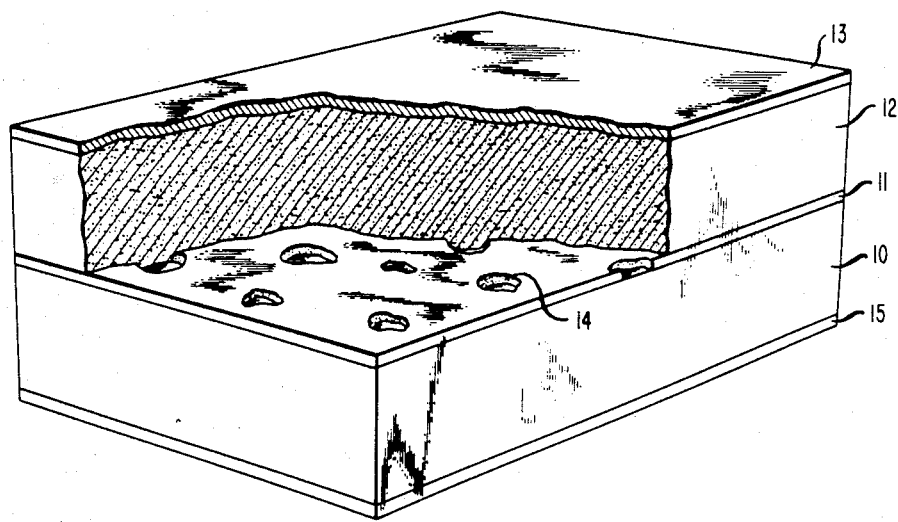
FIG. 1 schematically depicts a portion of a heterostructure according to the invention.

In the broadest sense, the invention is an electronic device comprising a composite structure, the structure comprising a single crystal Si substrate, a perforated silicide layer overlying the substrate, and crystalline Si overlying the silicide layer and extending through the perforations, and an etch-free method for producing the perforations. Typically, the silicide is a single crystal, epitaxial with the substrate, and, at least in currently preferred embodiments, the silicon overlayer is single crystal epitaxial with the silicide. The device may, in principle, comprise further layers, including a further silicide layer, but the discussion herein will be in terms of a three-level structure only. The device can be n-type or p-type, i.e., emitter and collector can be doped to have either n-type or p-type conductivity, with the doping levels in emitter and collector not necessarily equal.

A quantity that is significant for a description of the invention is W, the zero bias depletion width of a semiconductor. It can be approximately determined by the expression $$W = \sqrt{2\epsilon_s(V_{bi} - kT/q)/qN_b},$$

where
$\epsilon_S$ is the semiconductor permittivity,
$V_{bi}$ is the built-in potential of the junction,
k is the Boltzmann constant,
T is the absolute temperature,
q is the electron charge, and
$N_b$ is the net acceptor or donor density, as appropriate.

A central aspect of the invention is the requirement that the silicide layer (the base) be perforated, the openings extending through the layer. In at least some cases, the aspect ratio of the openings is of order 1 (i.e., $0.1 \lesssim d_{min}/d_{max} \lesssim 1$, where $d_{min}$ and $d_{max}$ are the minimum and maximum diameters of a typical opening, respectively). However, some growth conditions may result in formation of more elongated apertures, including strip-like apertures.

The disclosed method does not result in openings of uniform size, but rather in pinholes having a statistical size distribution. We currently believe that $\overline{D}$, the average effective diameter of the openings, can be substantially controlled by appropriate choice of substrate orientation and/or processing conditions, as will be discussed in more detail below. The spread of opening sizes, measured by the variance $\theta$, frequently is such that $\sigma/\overline{D} < 0.25$, i.e. about 95% of all openings have an effective diameter within about 50% of $\overline{D}$. Methods for determining the average value of a parameter of a distribution are known to those skilled in the art. The "effective diameter" of the apertures herein is twice the distance from the potential minimum in the aperture to the nearest edge of the aperture.

The perforation area density $A_p = 1 - A_s$ (where $A_s$ is the area fraction of the base that is silicide) is, for a given silicide thickness, a function of substrate orientation, annealing temperature, and deposition ratio of Co and Si, and possibly of other processing conditions. For practical reasons, the useful lower limit of $A_p$ is currently considered to be about 0.01, and the useful upper limit about 0.5. $A_p \gtrsim 0.5$ is believed to result in impractically high base resistance. We currently believe that films having perforations within the useful range of $A_p$ can, inter alia, be produced on substrates having a growth surface oriented to within 6° from (111). The details of the aperture distribution can be varied by appropriate choice of processing conditions. Although it is not necessary to use a "misoriented" (i.e., not parallel to (111)) substrate, we currently prefer such substrates, since we believe that their use results in perforated films having a more uniform distribution of aperture size.

We currently believe that formation of a perforated silicide layer according to the invention requires existence of a moderate lattice constant mismatch between Si and the silicide. Such mismatch exists in the Si/CoSi$_2$ system, and CoSi$_2$ is currently the preferred silicide. However, it may be possible to produce perforated silicide layers with mixed silicides (e.g., of composition $x$CoSi$_2$+(1−$x$)NiSi$_2$, 0<$x$<1), or with silicides other than cobalt silicide (e.g., nickel silicide or palladium silicide).

The prior art teaches that the base layer thickness of a PBT should be of the order of 0.1W, and that the width of the openings in the grating should be of the order of W. Similar requirements apply to the inventive device, with the silicide thickness advantageously between about 0.05W and about 0.5W, and $\overline{D}$ advantageously between about 0.1W and W.

This choice of dimensions results in a structure in which the current through the Si columns extending through the openings in the base can be controlled by changing the potential barrier height in the columns, and in which such potential barrier control is possible over a relatively wide range of $V_E$, the voltage between emitter and base.

FIG. 1 schematically shows a portion of a heterostructure according to the invention, with silicide layer 11 overlying Si single crystal 10, and Si crystal 12 overlying 11 and extending through openings 14 in the silicide layer to the underlying Si. Layers 13 and 15 serve as means for making electrical contact with the emitter and the collector of the heterostructure. Means for making electrical contact with the base are not shown.

Figure 2:
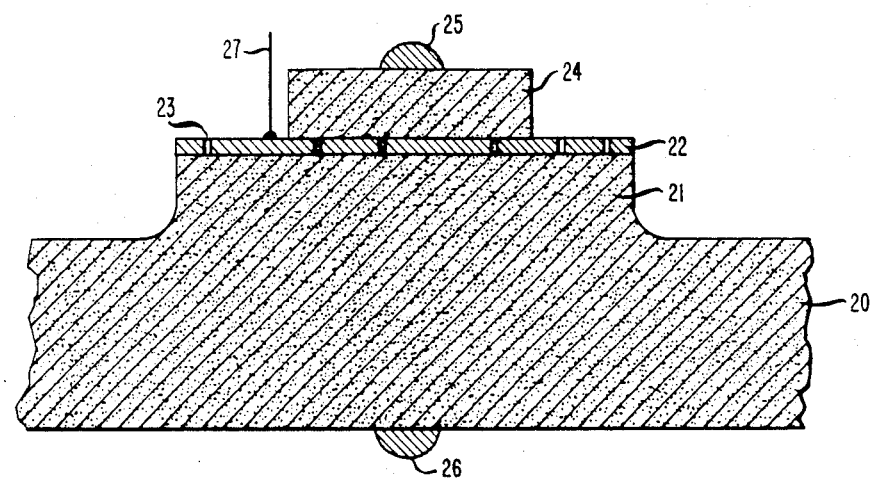
FIG. 2 shows schematically and in cross section an exemplary three terminal device according to the invention.

FIG. 2 shows schematically and in cross section a simple exemplary transistor structure according to the invention. A mesa 21 is formed in p-type Si substrate 20, with a cobalt silicide layer 22 of appropriate thickness (e.g., 100 Å) thereon. Layer 22 has perforations 23, with silicon columns extending from p-type Si overlayer 24 (exemplary thickness 0.25 μm) through thereby connecting the emitter with 21. Contacts 25 and 26 serve for making electrical contact to emitter and collector of the PBT, and base 22 can be contacted by means of point contact 27.

Figure 3:
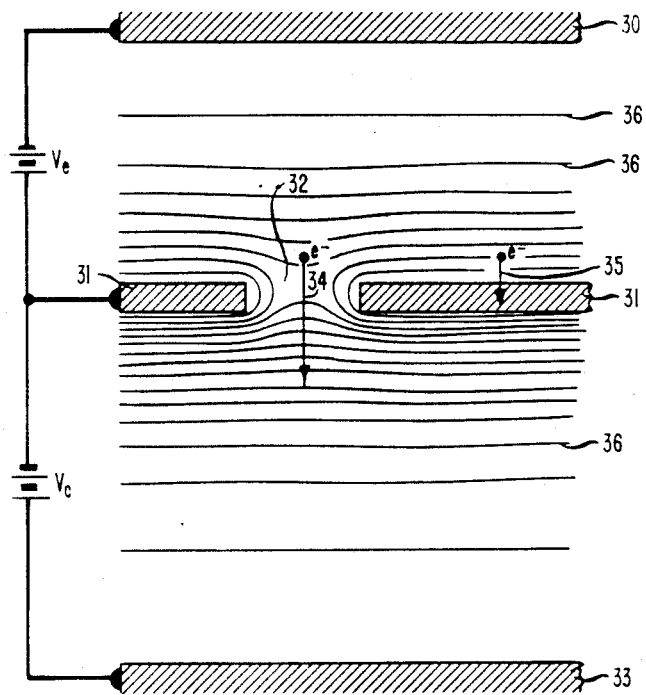
FIG. 3 shows a schematic model for electron transport in a hybrid device according to the invention.

FIG. 3 schematically depicts the potential distribution in a n-type device according to the invention, showing equipotential lines 36. A forward bias $V_E$ is applied between emitter contact 30 and base 31, and bias $V_c$, between 31 and collector contact 33, serves to reverse-bias the base-collector junction in the conventional manner. The equipotential surfaces close to the base layer have a "dimple" in the region of the opening, indicating the presence of a finite potential barrier between emitter and collector. Electrons 34 can flow through the Si column if they are sufficiently energetic. For $V_E=0$ the net flow of electrons is zero, but for $V_E<0$ the flow from emitter to collector increases approximately exponentially with decreasing $V_E$. Space charge limited operation is expected to occur if the emitter potential approaches the zero-bias barrier height in the opening. The behavior of the inventive device is thus qualitatively similar to prior art PBTs. However, due, inter alia, to the use of smaller openings in inventive devices, the operating characteristics of such devices resemble those of a bipolar transistor, in distinction from the more FET-like characteristics of prior art devices. The unique ability to control the zero-bias barrier height through choice of growth conditions permits a tailoring of the device operating characteristics. We believe that it may be possible to simultaneously achieve a very high transconductance as well as a large common emitter current gain ($\beta$) in inventive devices.

In preferred devices the silicide is a single crystal, epitaxial with the Si substrate. By this we mean that at least one crystal lattice direction [hkl], e.g., [111], in a substantial fraction of the overlying material is essentially parallel to the [uvw] crystal lattice direction in the substrate. In preferred embodiments, the Si material atop the silicide layer is epitaxial with the silicide.

As was disclosed in the previously cited patent application '060, the electron mean free path in CoSi$_2$ can be exceptionally long, making possible manufacture of ballistic electron devices in which the thickness of the silicide layer is less than the electron mean free path in the silicide at 25° C. Use of silicide having such long mean free path in devices according to the invention may result in a novel hybrid device in which a part of the collector current is injected into the base (the metal injection (MI) current), with a fraction thereof being transmitted ballistically across the silicide layer, and part flows through the columns of Si connecting emitter and base (the semiconductor transport (ST) current). This is schematically indicated in FIG. 3, where arrow 34 refers to the ST component of the current, and arrow 35 to the MI component.

Semiconductor devices according to the invention can be used as discrete devices, or be part of an integrated circuit of any desired complexity. In particular, they can be used in a variety of logic gates, in a manner similar to the use of PBTs as disclosed in '629. Potentially, devices according to the invention can be used at high frequencies, with a possible upper limit being an excess of 10 GHz.

The method for manufacturing devices according to the invention is an outgrowth of the method disclosed in '060. Briefly, an appropriately oriented and cut Si substrate is cleaned and prepared by methods well known in the art (A. Ishizaka et al., *Proceedings of the 2nd International Symposium on Molecular Beam Epitaxy*, Tokyo 1982, page 193), is maintained in a UHV environment (about $10^{-9}$ Torr or less) typically below about 100° C., during deposition of metal, or of metal and Si. Deposition can be by any appropriate method, suc as molecular beam or other vapor deposition method, by co-deposition, or by sequential deposition. Although we currently prefer deposition of metal at a low temperature, other conditions are also believed to result in useful perforated silicide layers. For instance, co-deposition of metal and Si at elevated temperature, e.g., about 600° C., can produce such layers. The fluxes are advantageously adjusted such that the deposit is metal-rich.

After deposition of the appropriate quantity of metal, metal and Si, or metal followed by Si, the substrate temperature is typically raised to a final (annealing) temperature, typically in the range 500°–800° C., and maintained at the final temperature for a few minutes, typically less than about 30 minutes. Optionally, the substrate temperature can first be raised to an intermediate temperature (300°–500° C.), and maintained at that temperature for a few minutes (typically less than 30 minutes).

In a typical processing sequence, we deposit about 30 Å of Co onto a doped Si substrate ($\theta=3°$) at 70° C. The rate of deposition typically is about 0.5 Å/sec. However, we believe that the deposition rates are not critical process parameters. Following metal deposition, the substrate is heated to about 450° C. and maintained at that temperature for about 1 minute. Following this optional intermediate temperature step, the substrate is maintained at about 700° for about 5 minutes.

With the above technique, we have produced suitably perforated single crystal $CoSi_2$. Layers produced by this technique were as thin as 50 Å, and we know of no reason why even thinner layers of device quality could not be formed.

Atop the thus produced perforated silicide layer is deposited silicon by any appropriate method. For instance, after raising the substrate temperature to a temperature between about 400° C. and about 700° C., preferably between about 500° C. and about 600° C., Si is deposited until the desired thickness of doped Si is reached. Again, the deposition rate is not critical; we have used rates between about 1 Å/sec and about 10 Å/sec.

By way of example, we have deposited a 2500 Å layer of Sb-doped Si onto an approximately 100 Å thick layer of Co $Si_2$, the substrate being at about 560° C. The Si was deposited from an evaporation source at a rate of about 5 Å/sec, Sb is evaporated from an effusion cell.

Silicon layers formed by the above process can also be doped by ion implantation, followed by an anneal. This and other doping techniques are known to those skilled in the art and require no elaboration.

The areal density of openings in a silicide layer of given thickness (in the thickness range of interest herein) increases with increasing angle $\theta$ between the substrate surface and the nearest (111) lattice plane, at least for $\theta \lesssim 6°$. A similar relationship may exist for other major lattice planes, e.g., (100).

The areal density is also a function of processing parameters such as annealing temperature and the metal/silicon ratio of the deposit. It is to be emphasized that orientation of the substrate close, but not parallel, to (111) may not be a necessary requirement of the inventive method, and we currently believe that a finite density of openings of appropriate size can be produced also in silicide layers of exactly (111) orientations, and also in layers of (100), or close to (100), orientation.

It is also to be emphasized that choice of processing conditions not only affects the number of openings in the silicide, but also the size, and possibly the shape of the apertures. For instance, we have observed that aperture size increases with increasing annealing temperature. By way of example, in a 90 Å $CoSi_2$ layer ($\theta = 3°$, grown from 25 Å of Co, with 50 Å of Si thereon) annealed at 690° C., the average effective diameter of the openings was observed to be nearly an order of magnitude larger than in a similar film annealed at 590° C.

We have also observed that number and size of openings, for a given film thickness, is a function of the metal/Si deposition ratio, i.e., the ratio of the amounts of the two materials deposited, in sequence of metal followed by Si, onto the substrate prior to annealing. In particular, silicide films formed from a Si-free deposit typically have greater $A_p$ than do films formed from a deposit that contains Si (e.g., Co/Si ratio 1:1), and the former films have a larger $\overline{D}$ than the latter. We currently believe that useful perforated $CoSi_2$ films can result from deposits of overall composition $CoSi_x$, $0 \leq x \lesssim 2$.

Other processing conditions, e.g., substrate preparation, cleaning, surface roughness, or vacuum conditions, may also affect the condition of the perforated silicide film.

Elevated temperatures mentioned throughout this application typically were determined by means of optical pyrometry, and thus are subject to the known uncertainty of that method. We believe that the temperatures are accurate to within ±25° C.

EXAMPLE 1

A wafer of n-type silicon (As-doped, resistivity about 0.07Ωcm, $\theta$ about 3°), was cleaned and otherwise prepared substantially as described in A. Ishizaka et al, op. cit.). With the substrate being at room temperature, we deposited in UHV a 22 Å thick layer of Co, followed by deposition of a 44 Å thick layer of Si. The temperature was raised to about 460° C., the wafer maintained at that temperature for about 1 minute, then the temperature was raised to about 600° C. and the wafer annealed at that temperature for about 15 minutes. This resulted in formation of a $CoSi_2$ layer of about 80 Å thickness. After cooling of the wafer to about 80° C., and without breaking of the vacuum, we deposited a 20 Å thick layer of Si onto the $CoSi_2$ layer. After raising the temperature of the wafer to about 670° C., we deposited about 0.25 $\mu$m of Sb-doped Si onto the previously deposited Si layer. After cooling below 100° C., we deposited 300 Å of heavily Sb-doped (n+) amorphous Si, raised the temperature to 650° C. for 10 minutes to allow epitaxial regrowth, lowered the temperature to about room temperature, and deposited a continuous metal layer to complete the ohmic contact. Collector contacts were formed by evaporating Sb onto the back surface of the wafer, and laser melting and recrystallizing appropriately located Sb-covered surface regions. This resulted in formation of degenerate contact regions.

The structure was examined by means of electron microscopy. We observed $A_p$ to be about 7%, with $\overline{D}$ about 800 Å.

We formed mesa structures on the top surface of the wafer by standard lithography and etching techniques. The mesas were basically circular (collector and base, respectively), having about 300 $\mu$m diameters, and the top Si layer (emitter) a diameter of about 200 $\mu$m. Electrical measurements were made on the mesa-type transistors by a conventional method. From the DC measurements we derived that the device had a common base current gain ($\alpha$) of about 0.5, and $\beta$ of about 1.2. Operated as a transistor, we observed an AC (1 MHz) voltage gain of about 10 (common base configuration, load resistance 5000Ω).

EXAMPLE 2

A heterostructure is prepared by depositing, onto a n-type Si substrate, ($\theta = 0° \pm 0.5°$, about 0.01Ωcm), prepared as discussed in Example 1, at room temperature about 30 Å of Co, raising the temperature to 590° C., for 3 minutes, lowering the temperature of 550° C., and depositing 0.25 $\mu$m of Sb-doped Si onto the silicide layer. The remaining processing steps are substantially as described in Example 1. The silicide layer has an areal density of apertures similar to that observed in Example 1.

What is claimed is:
1. A transistor comprising
   (a) a single crystal substrate comprising doped Si, the substrate having a major surface having an orientation with respect to the substrate crystal lattice;

(b) a layer of metal silicide in contact with the major surface of the substrate and forming a junction therewith, associated with the junction being a zero bias depletion width W, the thickness of the silicide layer being between about 5% and about 50% of W, the silicide layer having been formed by a process that comprises deposition of metal, or of metal and silicon, or of metal followed by silicon, onto the major surface of the substrate, and annealing of the deposit;

(c) a layer of silicon overlying at least a part of the silicide layer, the layer of silicon comprising doped silicon;

(d) means for making electrical contact to the substrate, the silicide layer and the layer of silicon, respectively; characterized in that (e) the silicide layer is perforated by a multiplicity of apertures, with silicon, or doped silicon, extending through at least some of the apertures, associated with each aperture being an effective diameter of the aperture, with the average of the effective diameter of the apertures being in the range from about 10% to about 100% of W, with the apertures in the silicide layer having been formed during formation of the silicide layer without use of lithography and/or etching.

2. Transistor of claim 1, wherein an electron means free path is associated with the silicide layer, the electron mean free path at 25° C. in the silicide layer being greater than the thickness of the silicide layer.

3. Transistor of claim 1, wherein the major surface of the substrate forms an angle $\theta$ with a (111) lattice plane of the substrate, with $\theta \lesssim 6°$.

4. Transistor of claim 1, wherein the device is associated with at least one other electronic device on a common silicon body.

5. Transistor of claim 1, wherein the metal is chosen from the group consisting of Co, Ni, and Pd.

6. Transistor of claim 5, wherein the metal is Co.

7. Method of fabricating a transistor comprising
(a) providing a single crystal Si substrate comprising doped silicon and a major surface;

(b) forming on at least a part of the major surface a metal silicide layer, the substrate with the silicide layer thereon forming a junction, associated with the junction being a zero bias depletion width W, the silicide layer thickness being between about 5% and about 50% of W, at least substantial part of the silicide layer being epitaxial with the substrate, the silicide layer formed by a process that comprises deposition of metal, or of metal and silicon, or of metal followed by silicon, onto the major surface of the substrate, and annealing of the deposit;

(c) forming a layer of silicon on at least a part of the silicide layer, the silicon layer comprising doped Si; and (d) providing means for electrically contacting the substrate, the silicide layer, and the silicon layer, respectively; characterized in that (e) the silicide layer is perforated silicide layer comprising a multiplicity of apertures, with silicon, or doped silicon, extending through at least some of the apertures, associated with each aperture being an effective diameter of the aperture, with the average of the effective diameter of the apertures being in the range from about 10% to about 100% of W, the apertures in the silicide layer formed during step (b) without use of lithography and/or etching.

8. Method of claim 7, wherein forming the silicide layer comprises depositing a metal selected from the group consisting of Co, Ni, and Pd, or of the metal and Si, or of the metal followed by Si, onto the major surface of the substrate, and maintaining the substrate at a temperature in the range from about 500° to about 800° C. for a time effective for producing the silicide layer.

9. Device of claim 7, wherein the orientation of the major surface of the substrate is within about 6° of a (111) lattice plane of the substrate.

* * * * *